United States Patent
Yamamoto et al.

(10) Patent No.: US 7,516,768 B2
(45) Date of Patent: Apr. 14, 2009

(54) METHOD AND APPARATUS FOR JOINING PROTECTIVE TAPE

(75) Inventors: Masayuki Yamamoto, Osaka (JP); Norio Mori, Mie-ken (JP); Takashi Nishinohama, Mie-ken (JP); Atsushi Ogawa, Mie-ken (JP)

(73) Assignee: Nitto Denko Corporation, Osaka (JP)

( * ) Notice: Subject to any disclaimer, the term of this patent is extended or adjusted under 35 U.S.C. 154(b) by 452 days.

(21) Appl. No.: 11/182,761

(22) Filed: Jul. 18, 2005

(65) Prior Publication Data

US 2006/0037694 A1 Feb. 23, 2006

(30) Foreign Application Priority Data

Aug. 19, 2004 (JP) ............................. 2004-239502

(51) Int. Cl.
*B32B 37/22* (2006.01)
*B32B 38/04* (2006.01)

(52) U.S. Cl. ...................... 156/510; 156/250; 156/267; 156/353; 83/13; 83/34; 83/869

(58) Field of Classification Search ................ 156/250, 156/510, 267, 353; 83/34, 869, 13; 451/44
See application file for complete search history.

(56) References Cited

U.S. PATENT DOCUMENTS

| 4,925,515 | A | * | 5/1990 | Yoshimura et al. | ........... 156/250 |
| 6,080,263 | A | * | 6/2000 | Saito et al. | ................. 156/253 |
| 6,910,403 | B1 | * | 6/2005 | Ishikawa et al. | ............... 83/34 |

FOREIGN PATENT DOCUMENTS

JP 2004-025438 A 1/2004

* cited by examiner

*Primary Examiner*—Christopher C Caillouet
(74) *Attorney, Agent, or Firm*—Cheng Law Group PLLC

(57) ABSTRACT

In a method for allowing a cutter blade to relatively travel along an outer periphery of a semiconductor wafer to cut a protective tape joined to a surface of the semiconductor wafer in conformity with an outer shape of the semiconductor wafer, the cutter blade is allowed to relatively travel along the outer periphery of the semiconductor wafer with a positioning notch provided on the outer periphery thereof. The cutter blade is rotationally turned at the fore half of the notch recessed on the outer periphery of the semiconductor wafer during the relative travel of the cutter blade in such a manner that its blade tip is directed toward the center of the wafer. In contrast, the cutter blade is rotationally turned at the rear half of the notch in such a manner that its blade tip is directed toward the outer periphery of the semiconductor wafer.

6 Claims, 10 Drawing Sheets

METHOD AND APPARATUS FOR JOINING PROTECTIVE TAPE

BACKGROUND OF THE INVENTION (1) Field of the Invention

The invention relates to a method and apparatus for joining a protective tape. Herein, a protective tape is joined onto a semiconductor wafer mounted on and held by a chuck table. Thereafter, a cutter blade is allowed to travel along an outer periphery of the semiconductor wafer in a state where the cutter blade sticks out of the joined protective tape, so that the joined protective tape is cut in conformity with an outer shape of the semiconductor wafer.

(2) Description of the Related Art

A method for cutting a protective tape joined onto a surface of a semiconductor wafer is as follows. A protective tape is supplied onto a surface of a semiconductor wafer mounted on and held by a chuck table, and then, is joined onto the surface of the semiconductor wafer by rolling a joining roller on a non-adhesive face of the protective tape. Thereafter, a cutter blade is allowed to relatively travel along an outer periphery of the semiconductor wafer by rotating the chuck table in a state where the cutter blade sticks out of the protective tape, so that the protective tape is cut along the outer periphery of the semiconductor wafer. Furthermore, a projecting quantity of the protective tape at a peripheral edge of the semiconductor wafer is arbitrarily adjusted according to a thickness of the semiconductor wafer or a chamfering form of the peripheral edge of the semiconductor wafer by varying and adjusting a crossing angle of the cutter blade with respect to the surface of the semiconductor wafer (see, for example, JP-A 2004-25438).

Such a method for cutting the protective tape employs a structure for varying and adjusting a tilt angle of a cutter unit on a fulcrum set at an upper position above the table, in order to vary and adjust the crossing angle of the cutter blade with respect to the surface of the semiconductor wafer. Therefore, the vertical position of the entire cutter blade is varied when the angle of the cutter blade is varied, so that the cut position of the protective tape is varied. As a result, it is necessary to adjust the angle and height of the cutter blade with a cumbersome trouble.

SUMMARY OF THE INVENTION

The invention has been accomplished in view of the above-mentioned circumferences. Therefore, a principal object of the invention is to provide a protective tape joining apparatus capable of promptly adjusting and setting a cutter blade at a positional posture suitable for a semiconductor wafer or a protective tape, thus smoothly and favorably cutting the protective tape in conformity with the outer shape of the semiconductor wafer.

In order to achieve the above-mentioned object, the invention employs the following configuration.

A method for joining a protective tape, comprising the steps of:

rolling a joining roller on a wide protective tape supplied onto a semiconductor wafer while pressing the joining roller against a non-adhesive face of the semiconductor wafer, thereby joining the protective tape to the semiconductor wafer;

sticking a cutter blade out of an outer periphery of the semiconductor wafer; and turning and varying the cutter blade on an axis along a back edge of a tip of the cutter blade by means of an actuator, so as to allow the cutter blade to relatively travel along the outer periphery of the semiconductor wafer while varying a cutting angle with respect to an advance direction of the cutter blade.

With this method according to the invention, the tape can be smoothly cut in conformity with the outer shape of a semiconductor wafer having a variable outer shape such as a semiconductor wafer provided with a wafer positioning orientation flat or a semiconductor wafer provided with a positioning notch by controllably varying the cutting angle in accordance with detection of a traveling position of the cutter blade.

In order to achieve the above-mentioned object, the invention also employs the following configuration.

A method for joining a protective tape, comprising the steps of:

rolling a joining roller on a wide protective tape supplied onto a semiconductor wafer while pressing the joining roller against a non-adhesive face of the semiconductor wafer, thereby joining the protective tape to the semiconductor wafer;

sticking a cutter blade out of an outer periphery of the semiconductor wafer; and forcibly tilting the cutter blade on a tape cutting point of the cutter blade by means of an actuator, so as to allow the cutter blade to relatively travel along the outer periphery of the semiconductor wafer while varying a crossing angle of the cutter blade with respect to the surface of the semiconductor wafer.

With this method according to the invention, a projecting quantity of the protective tape at the peripheral edge of the semiconductor wafer can be adjusted according to a thickness of the semiconductor wafer or a chamfering form of the peripheral edge of the semiconductor wafer by varying and adjusting the crossing angle of the cutter blade with respect to the surface of the semiconductor wafer. In this case, if a control program for adjusting the crossing angle of the cutter blade is previously set according to the specifications of the semiconductor wafer, a cutting operation can be promptly started at a preferred crossing angle only by inputting and setting conditions of a workpiece by the use of an appropriate input device such as an operating key or a barcode reader.

Additionally, since the cutter blade is tilted on the tape cutting point, such adjustment cannot largely vary the height of a portion to be cut by the cutter blade, thereby shortening a time required for adjustment when a workpiece is changed.

In order to achieve the above-mentioned object, the invention also employs the following configuration.

A method for joining a protective tape, comprising the steps of:

rolling a joining roller on a wide protective tape supplied onto a semiconductor wafer while pressing the joining roller against a non-adhesive face of the semiconductor wafer, thereby joining the protective tape to the semiconductor wafer;

sticking a cutter blade out of an outer periphery of the semiconductor wafer; and allowing the cutter blade to relatively travel along the outer periphery of the semiconductor wafer while forcibly moving the cutter blade to plural positions at different distances from a turn center of the cutter blade by means of an actuator.

With this method according to the invention, the position of the cutter blade can be varied at a turn radius suitable for a workpiece by inputting and setting the workpiece by the use of an appropriate input device.

In order to achieve the above-mentioned object, the invention also employs the following configuration.

A method for joining a protective tape, comprising the steps of:

rolling a joining roller on a wide protective tape supplied onto a semiconductor wafer while pressing the joining roller against a non-adhesive face of the semiconductor wafer, thereby joining the protective tape to the semiconductor wafer;

sticking a cutter blade out of an outer periphery of the semiconductor wafer; and movably supporting the cutter blade in its turn radial direction and biasing the cutter blade in a direction approaching a turn center, so as to allow the cutter blade to relatively travel along the outer periphery of the semiconductor wafer while forcibly moving the biased cutter blade in a direction reverse to the bias direction by means of an actuator.

With this method according to the invention, the cutter blade can be descended without any contact with the semiconductor wafer, to stick out of the protective tape by forcibly displacing the cutter blade at a position displaced slightly outside of the outer periphery of the semiconductor wafer by the use of the actuator at the beginning of the tape cutting process. Thereafter, the cutter blade can be biasingly moved toward the turn center by releasing the forcibly displacing operation by means of the actuator, so that the tape can be cut out in conformity with the outer shape of the semiconductor wafer with high accuracy by allowing the cutter blade to travel while resiliently pressing the cutter blade against the outer periphery of the semiconductor wafer by a bias force on an adequate level.

In order to achieve the above-mentioned object, the invention also employs the following configuration.

An apparatus for joining a protective tape, comprising:

protective tape supplying means for supplying a protective tape onto a surface of a semiconductor wafer mounted on and held by a chuck table;

a joining unit for rolling a joining roller on the protective tape, thereby joining the protective tape to the surface of the semiconductor wafer while pressing the protective tape against the semiconductor wafer;

a protective tape cutting mechanism for cutting the joined protective tape in conformity with an outer shape of the semiconductor wafer while allowing the cutter blade to travel along the outer periphery of the semiconductor wafer in a state where a cutter blade sticks out of the protective tape joined onto the semiconductor wafer;

cutter ascending/descending means, provided in the protective tape cutting mechanism, for ascending/descending the cutter blade between an upper standby position and a lower cutting acting position;

cutter turning means for turning the cutter blade located at the cutting acting position on a vertical axis passing substantially the center of the chuck table; and plural adjusting means such configured as to be independently controlled by an actuator in such a manner as to vary a posture or position of the cutter blade.

With this apparatus according to the invention, the posture or position of the cutter blade is controllably adjusted according to various conditions such as the size of the semiconductor wafer and the type of protective tape by actuating the plural adjusting means in the protective tape cutting process after the protective tape is joined onto the surface of the semiconductor wafer. In this case, since each of the adjusting actuations is independently controlled by the use of the actuator, the protective tape can be speedily cut in a preferred manner only by inputting and setting conditions of a workpiece if a specification program for each of adjustment controls is previously set according to various cutting conditions.

Herein, examples of the plural adjusting means includes the following adjusting means:

first adjusting means for turning and varying the cutter blade on an axis along a back edge of a tip of the cutter blade by means of the actuator, so as to vary a cutting angle with respect to an advance direction of the cutter blade;

second adjusting means for turnably supporting the cutter blade relatively to a member forcibly turned by the actuator within a set range on the axis along the back edge of the blade tip and, also, turningly biasing the cutter blade in a direction reverse to a cutter turning direction;

third adjusting means for forcibly tilting the cutter blade on a tape cutting point of the cutter blade by means of the actuator, so as to vary a crossing angle of the cutter blade with respect to the surface of the semiconductor wafer; and fourth adjusting means for forcibly moving the cutter blade to plural positions at different distances from a turn center of the cutter blade by means of the actuator.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Description will be given below of one embodiment of the invention with reference to the attached drawings.

Figure 1:
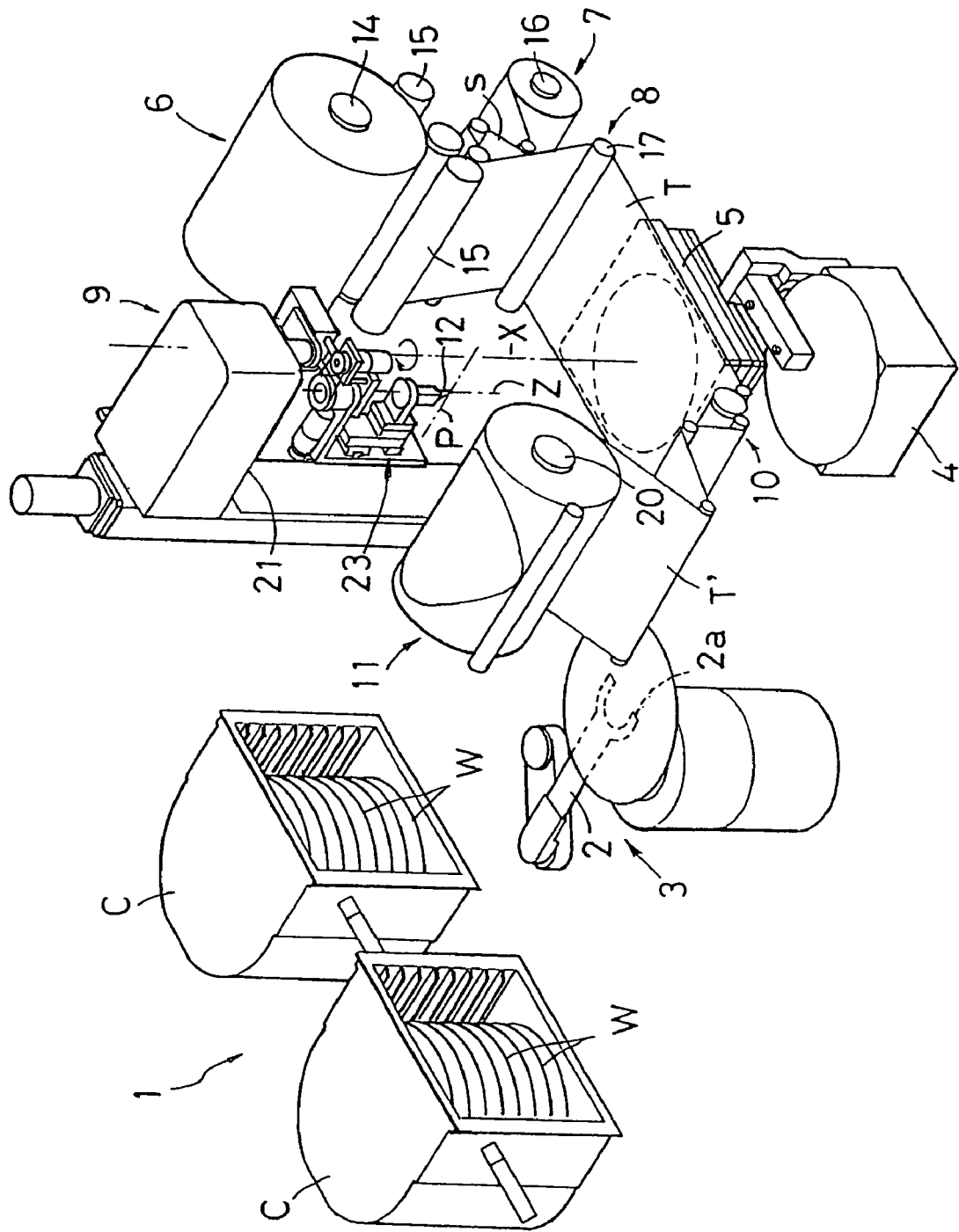
FIG. 1 is a perspective view generally showing a protective tape joining apparatus according to one embodiment of the invention.

FIG. 1 is a perspective view showing the entire configuration of a protective tape joining apparatus. The protective tape joining apparatus comprises a wafer supplying/collecting unit 1, in which cassettes C containing semiconductor wafers (hereinafter, simply referred to as "wafers") W therein are installed, a wafer transporting mechanism 3 provided with a robot arm 2, an alignment stage 4, a chuck table 5 for adsorbing and holding the wafer W mounted thereon, a tape supplying unit 6 for supplying a protective tape T with a separator s for protecting a surface of the wafer W onto the wafer W, a separator collecting unit 7 for separating the separator s from the protective tape T supplied from the tape supplying unit 6, and collecting the separator s, a joining unit 8 for joining the protective tape T onto the wafer W sucked and held by the chuck table 5, a tape cutting mechanism 9 for cutting the protective tape T joined to the wafer W in conformity with an outer shape of the wafer W, a separating unit 10 for separating an unnecessary tape T' remaining after the protective tape T is joined to the wafer W to be cut, and a tape collecting unit 11 for winding and collecting the unnecessary tape T' separated by the separating unit 10. Hereinafter, description will be given of a specific configuration of each of structures and mechanisms.

In the wafer supplying/collecting unit 1, two sets of cassettes C can be installed in parallel to each other. In each of the cassettes C, a number of wafers W, each having a wiring pattern face directed upward, are insertingly stacked in multiple stages in a horizontal manner.

The robot arm 2 provided to the wafer transporting mechanism 3 is configured in such a manner as to movably advance/retreat in a horizontal direction and, also, the entire robot arm 2 can be driven to be turned and ascended/descended. A horseshoe-shaped wafer holder 2a of a vacuum suction type is attached to the tip of the robot arm 2. The wafer W is sucked and held at the back surface thereof by inserting the wafer holder 2a into an interval between the wafers W stacked in the multiple stages in the cassette C. The sucked and held wafer W is taken out of the cassette C and, then, is transported to the alignment stage 4, the chuck table 5 and the wafer supplying/collecting unit 1 in this order.

The alignment stage 4 is adapted to align the wafer W, which is transported by the wafer transporting mechanism 3 and is mounted thereon, according to an orientation flat or a notch formed at the outer periphery of the wafer W.

The chuck table 5 is designed to vacuum-suck the wafer W, which is transferred from the wafer transporting mechanism 3 and is mounted thereon in a predetermined positioning posture. Furthermore, at the upper face of the chuck table 5 are formed cutter traveling grooves 13 (see FIG. 2) for cutting the protective tape T by turning and moving a cutter blade 12, which is provided to the tape cutting mechanism 9, described later, in conformity with the outer shape of the wafer W.

The tape supplying unit 6 allows the protective tape T with the separator unreeled from a supplying bobbin 14 to be wound around a pair of guide rollers 15 under guidance, so as to introduce the protective tape T separated from the separator s to the joining unit 8. A moderately rotational resistance is applied to the supplying bobbin 14, thereby preventing the tape from being excessively unreeled.

The separator collecting unit 7 is designed to rotationally drive a collecting bobbin 16 for winding up the separator s separated from the protective tape T in a winding-up direction.

The joining unit 8 is provided with a joining roller 17 facing forward in a horizontal direction. The joining unit 8 is driven to laterally reciprocate in the horizontal direction by a slide guiding mechanism 18 (see FIG. 7) and a screw feeding-type drive mechanism (not shown).

The separating unit 10 is provided with a separating roller 19 facing forward in a horizontal direction. The separating unit 10 is driven to laterally reciprocate in the horizontal direction by the slide guiding mechanism 18 and the screw feeding-type drive mechanism (not shown).

In the tape collecting unit 11, a collecting bobbin 20 for winding-up the unnecessary tape T' is rotationally driven in a winding-up direction.

The tape cutting mechanism 9 is basically provided, in a cantilever horizontal posture, with a support arm 22 (see FIG. 2) drivingly turnable on a vertical axis X, serving as a turn center, passing substantially the center of the chuck table 5 under a movable mount 21 capable of drivingly ascending/descending. A cutter unit 23 disposed at the tip of the support arm 22 includes the cutter blade 12 having a blade tip facing downward. The cutter blade 12 travels along the outer periphery of the wafer W when the support arm 22 is turned on the axis X, to thus cut the protective tape T. The detailed structure is shown in FIGS. 2 to 5.

Figure 2:
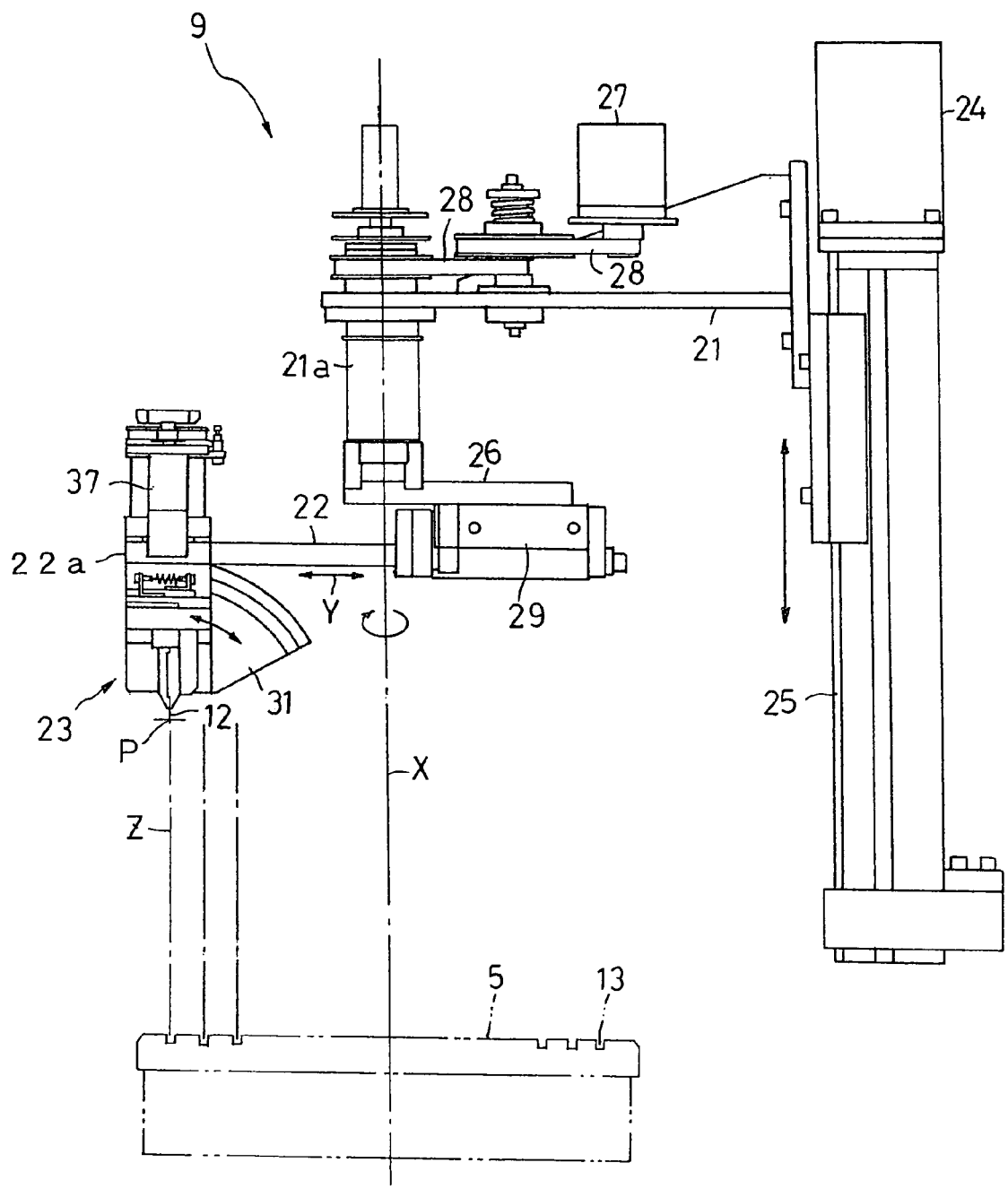
FIG. 2 is a front view showing a tape cutting mechanism.

As shown in FIG. 2, the movable mount 21 is ascended/descended by screw feeding along a vertical rail 25 when a motor 24 is driven to be rotated forward or reversely. A rotor 26 is supported by a boss 21a disposed at a loose end of the movable mount 21 in a manner turnable on the vertical axis X. The rotor 26 is reduced in speed in association with a motor 27 disposed above the movable mount 21 via two belts 28. As a consequence, the rotor 26 is rotated at a low speed in a predetermined direction by the actuation of the motor 27.

Under the rotor 26 is supported the support arm 22 in such a manner as to freely advance/retreat in a horizontal direction Y by an air cylinder (actuator) 29. Further, the cutter unit 23 is supported at a loose end 22a of the support arm 22, as described later. That is, the turn radius of the cutter blade 12 can be controllably adjusted according to the diameter of the wafer if the support arm 22 is moved and adjusted in the horizontal direction Y by controllably actuating the air cylinder 29. Herein, the support arm 22 and the air cylinder 29 constitute third adjusting means according to the invention.

Figure 3:
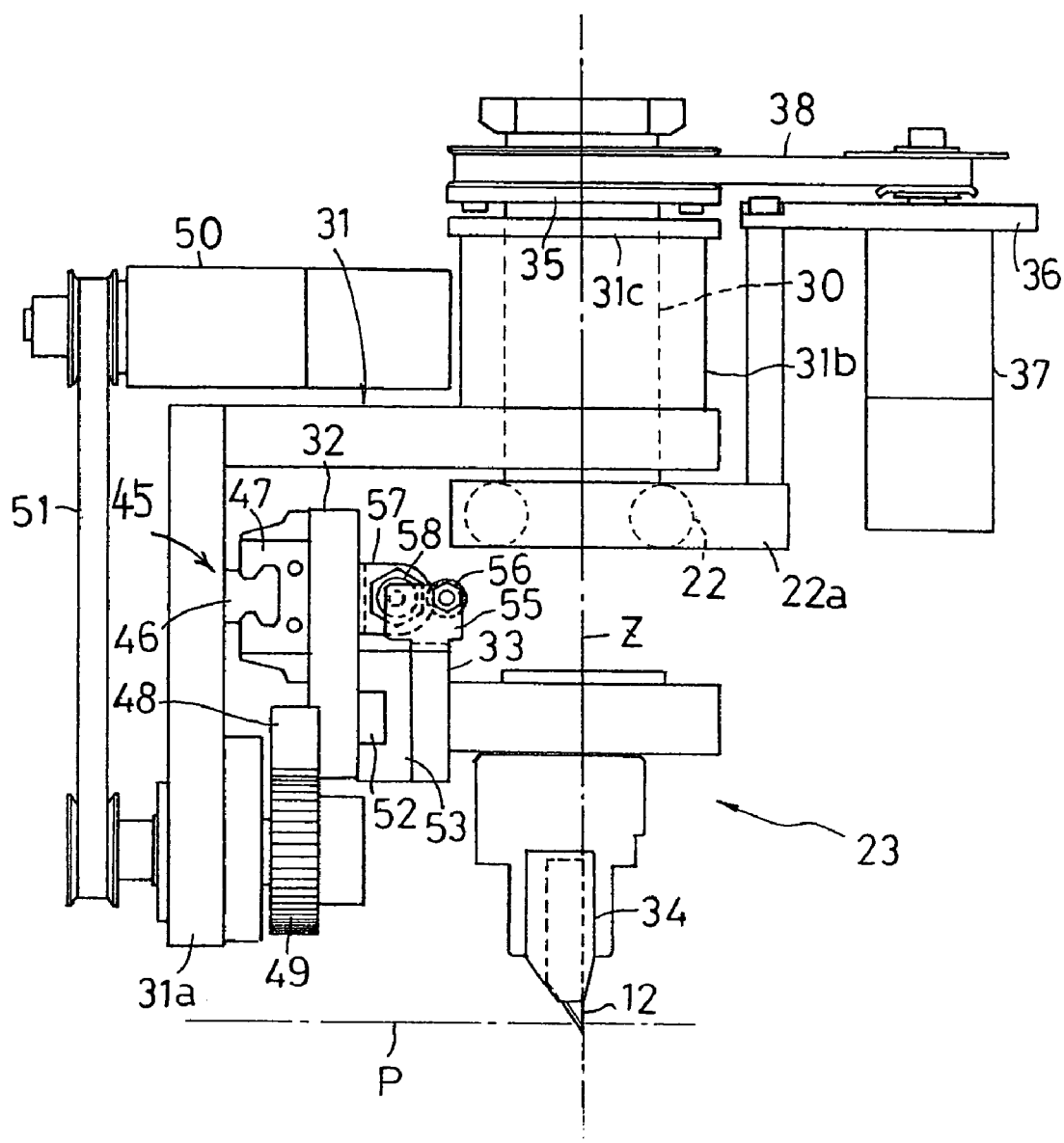
FIG. 3 is a side view showing a main part in the tape cutting mechanism.

As shown in FIG. 3, the cutter unit 23 is constituted of an inverted L-shaped turning bracket 31, which is turnably supported at the tip 22a of the support arm 22 on a vertical axis Z via a strut 30, a movable member 32 supported at a front face of a vertical side 31a of the turning bracket 31, a cutter supporting member 33 connectably supported at the front face of the movable member 32, and a cutter holder 34 attached to the cutter supporting member 33. Herein, the cutter blade 12 is secured to the cutter holder 34 in such a manner that the back edge of the blade tip substantially coincides with the axis Z.

At the upper end of a base end boss 31b of the turning bracket 31 is continuously disposed a turning plate 31c and, also, a support plate 35 is disposed on the axis Z in such a manner as to be freely rotated relatively to the turning plate 31c. A pulse motor (actuator) 37 attached to the tip of the support arm 22 via a stay 36 and the support plate 35 are wound in association via a belt 38.

Figure 13A:
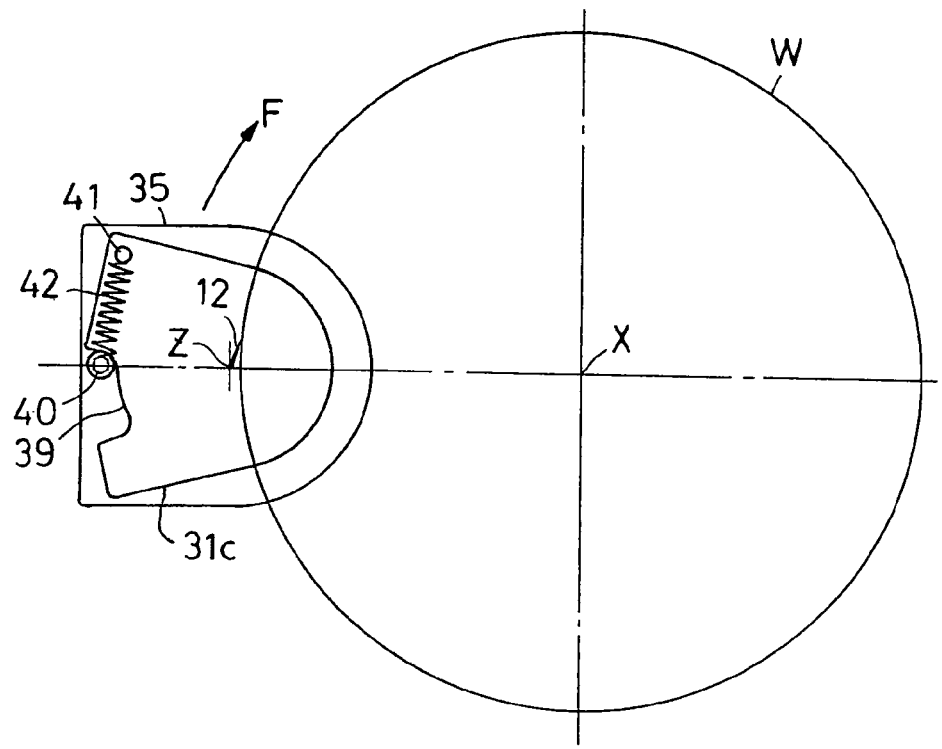
FIGS. 13A and 13B are schematic plan views each illustrating a cutting angle automatic adjusting operation.
Figure 13B:
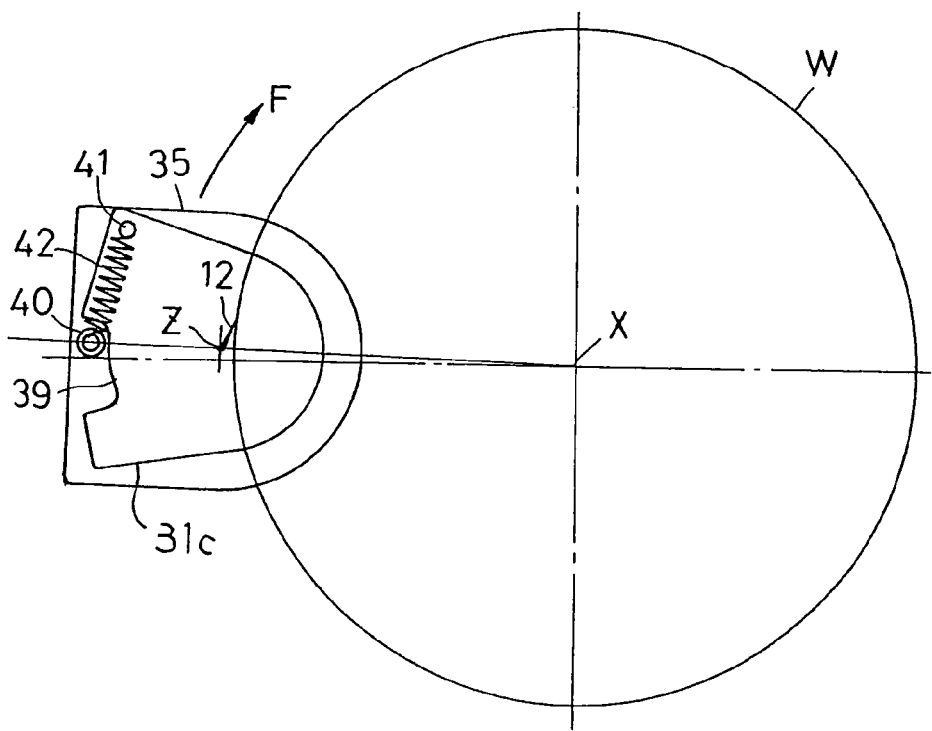

As shown in FIGS. 13A and 13B, the relatively turning range of the support plate 35 and the turning plate 31c on the axis Z is limited by allowing a stopper pin 40 disposed at the support plate 35 to be engaged with a cutout recess 39 formed at the turning plate 31c and, also, a spring 42 is stretched between a pin 41 disposed at the turning plate 31c and the stopper pin 40 disposed at the support plate 35. The turning plate 31c is turnably biased with respect to the support plate 35 in a direction reverse to a cutter turning direction F on the axis Z by tension of the spring 42. Therefore, the turning plate 31c is normally biased and held at one end within the relatively turning range, as shown in FIG. 13A.

With the above-mentioned configuration, the entire turning bracket 31 can be turned on the axis Z via the turning plate 31c by controlling the turning posture of the support plate 35 by the actuation of the pulse motor 37, thereby controlling a cutting angle α (see FIG. 11) in the advance direction of the cutter blade 12. Moreover, when the turning plate 31c is forcibly turned on the axis Z against the spring 42 in a state where a predetermined cutting angle α is achieved, the cutter blade 12 is turned on the axis Z in the same direction as the cutter turning direction. Consequently, the cutting angle α becomes greater than that set by the turning adjustment of the support plate 35. Herein, the support plate 35, the movable plate 31c, the stopper pin 40, the pin 41 and the spring 42 constitute first adjusting means according to the invention.

Figure 4:
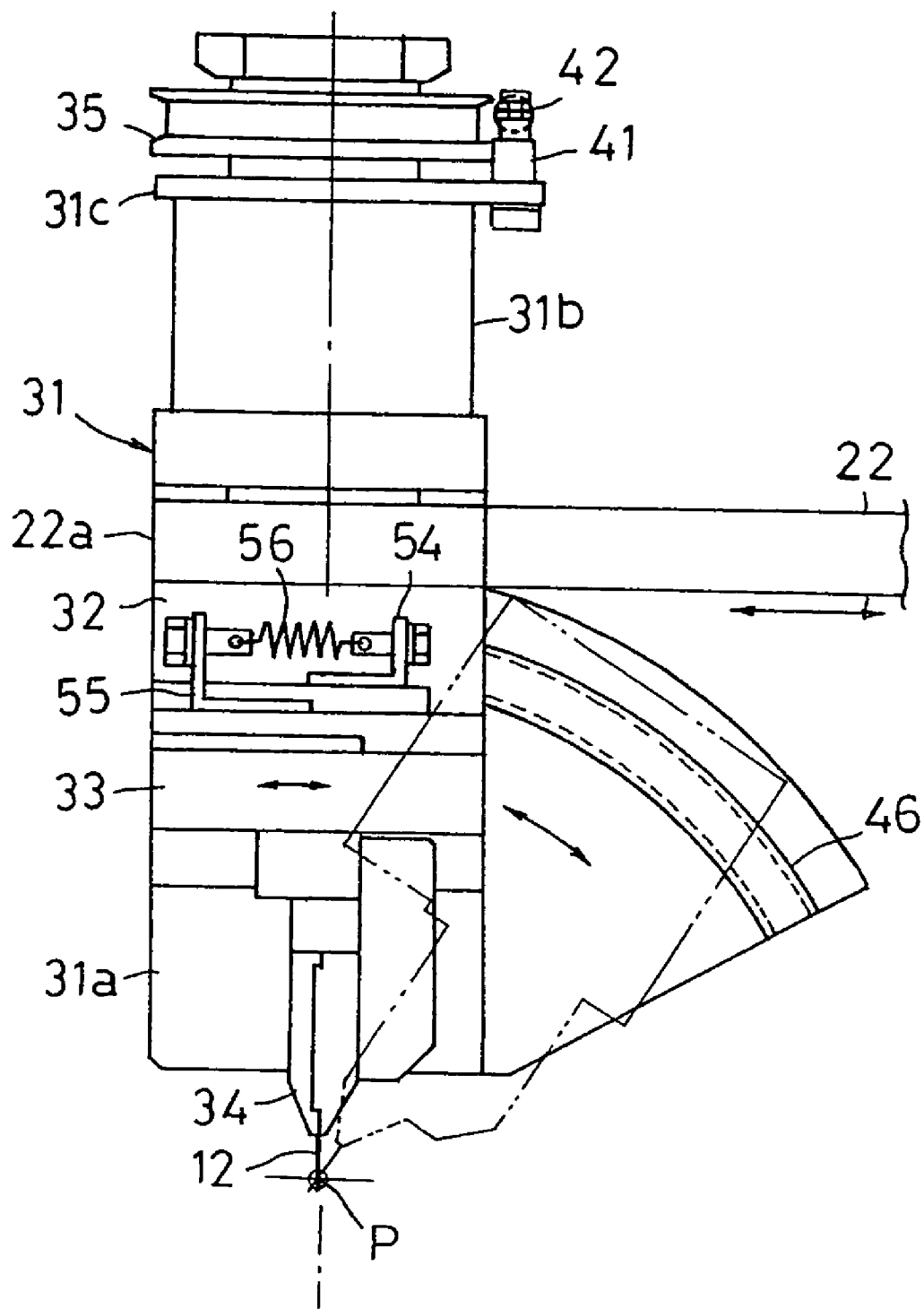
FIG. 4 is a front view showing a main part in the tape cutting mechanism.
Figure 5:
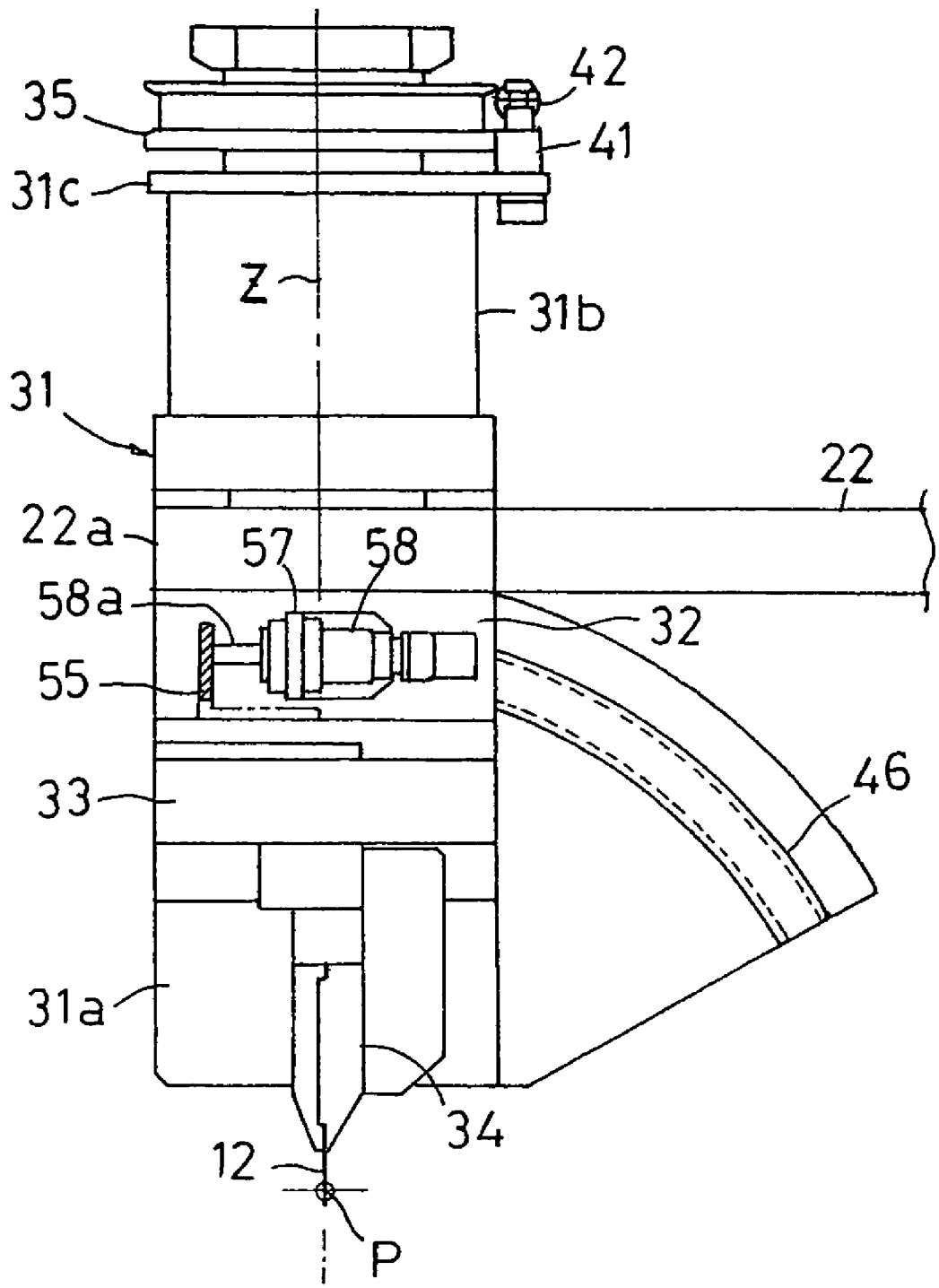
FIG. 5 is a front view showing a main part in the tape cutting mechanism.
Figure 6A:
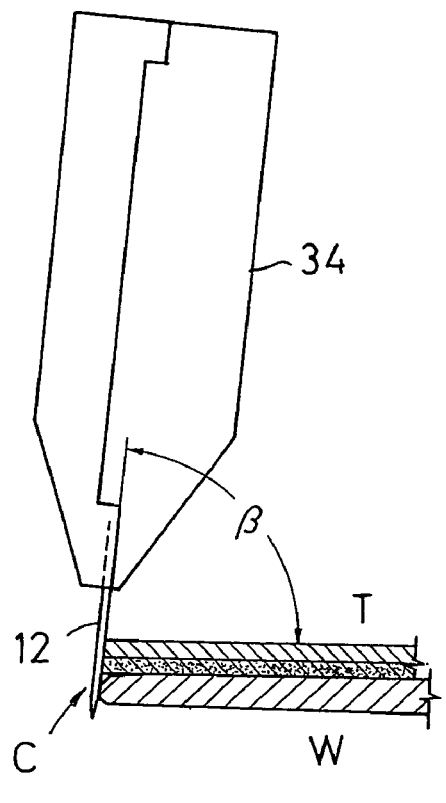
FIGS. 6A and 6B illustrate a crossing angle of a cutter blade.
Figure 6B:
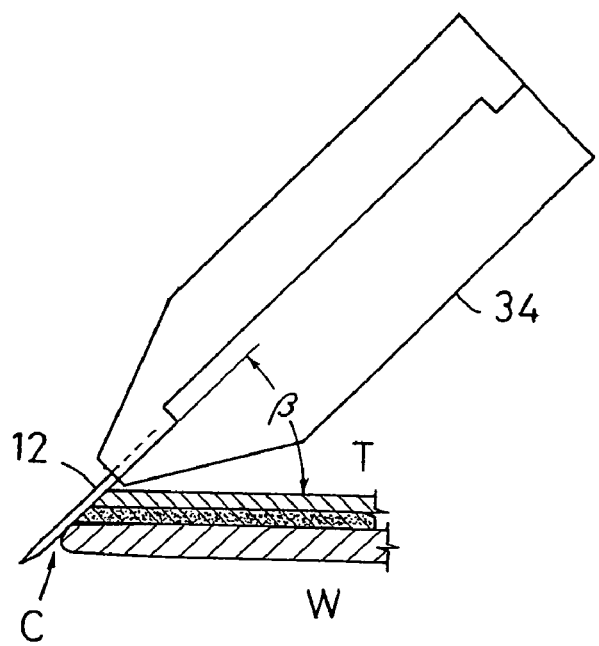

As shown in FIGS. 3 to 5, the movable member 32 is slidably connected onto the vertical side 31a of the turning bracket 31 via a slide guiding mechanism 45. The slide guiding mechanism 45 includes a partly arcuate guide rail 46 attached to the front face of the vertical side 31a and a slide block 47 attached to the back face of the movable member 32 and slidably fitted around the guide rail 46. In other words, the movable member 32 can be slidably turned with respect to the vertical side 31a on a curvature center P of the guide rail 46, serving as a fulcrum, by moving the slide block 47 along the guide rail 46. The curvature center P of the guide rail 46 is set to be positioned at a tape cutting point C at the tip of the cutter blade 12. The slide turning adjustment can vary and adjust a crossing angle β (see FIGS. 6A and 6B) of the cutter blade 12 with respect to the wafer surface within a predetermined range.

A driving structure for driving and moving the movable member 32 along the guide rail 46 is configured as described below. Specifically, an arcuate rack gear 48 recessed and bent downward is disposed at a lower portion of the movable member 32 and, also, a pinion gear 49 meshed with the rack gear 48 is pivoted at the front face of the lower portion on the vertical side 31a in the turning bracket 31. The pinion gear 49 is wound in association with a pulse motor (actuator) 50 disposed above the turning bracket 31 via a belt 51. Thus, the rack gear 48 is relatively moved in mesh by controllably turning the pinion gear 49 by the actuation of the pulse motor 50. In other words, the movable member 32 provided with the rack gear 48 is designed to be controllably slid along the guide rail 46. Herein, the slide guiding mechanism 45, the guide rail 47, the slide block 47, the rack gear 48, the pinion gear 49, the pulse motor 50, the belt 51 and the like constitute second adjusting means according to the invention.

Additionally, the cutter supporting member 33 is slidably supported straight in parallel to the advance/retreat direction Y of the support arm 22 via a straight guide rail 52 and a slide block 53 fitted around the straight guide rail 52 with respect to the movable member 32 controllably slid, as described above (see FIG. 3). The cutter supporting member 33 is slidably biased toward the axis X serving as the cutter turn center by a spring 56 stretched between a spring receiving fitting 54 disposed in the movable member 32 and another spring receiving fitting 55 disposed in the cutter supporting member 33 (see FIG. 4). Moreover, a piston rod 58a of an air cylinder (actuator) 58 attached to the movable member 32 via a bracket 57 is disposed in a manner abuttable against the spring receiving fitting 55. When the spring receiving fitting 55 is pressed by driving the piston rod 58a in such a manner as to extend, the cutter supporting member 33 is slidably displaced in a direction remote from the axis X against the spring 54. Herein, the straight guide rail 52, the slide block 53, the spring receiving fittings 54 and 55, the spring 56, the bracket 57, the air cylinder 58 and the like constitute fourth adjusting means according to the invention.

Subsequently, description will be given below of a series of basic operations for joining the protective tape T to surface of the wafer W and cutting the protective tape T by using the above-mentioned apparatus according to the embodiment.

(1) Upon receipt of a joining command, first, the robot arm 2 in the wafer transporting mechanism 3 is moved toward the cassette C mounted on and installed in the wafer supplying/collecting unit 1, and then, the wafer holder 2a is inserted into the clearance defined between the wafers contained in the cassette C. The wafer holder 2a suction-holds the wafer W at the back face (lower face). In this state, the wafer W is transported, and then, the taken wafer W is transferred onto the alignment stage 4.

(2) The wafer W mounted on the alignment stage 4 is positioned by the use of the notch formed at the outer periphery of the wafer W. The positioned wafer W is transported again by the robot arm 2, to be thus mounted on the chuck table 5.

(3) The wafer W mounted on the chuck table 5 is suction-held in a state where its center is positioned on the center of the chuck table 5. At this time, as shown in FIG. 7, the joining unit 8 and the separating unit 10 stand by at their left initial positions while the cutter blade 12 of the tape cutting mechanism 9 stands by at its upper initial position, respectively.

Figure 7:
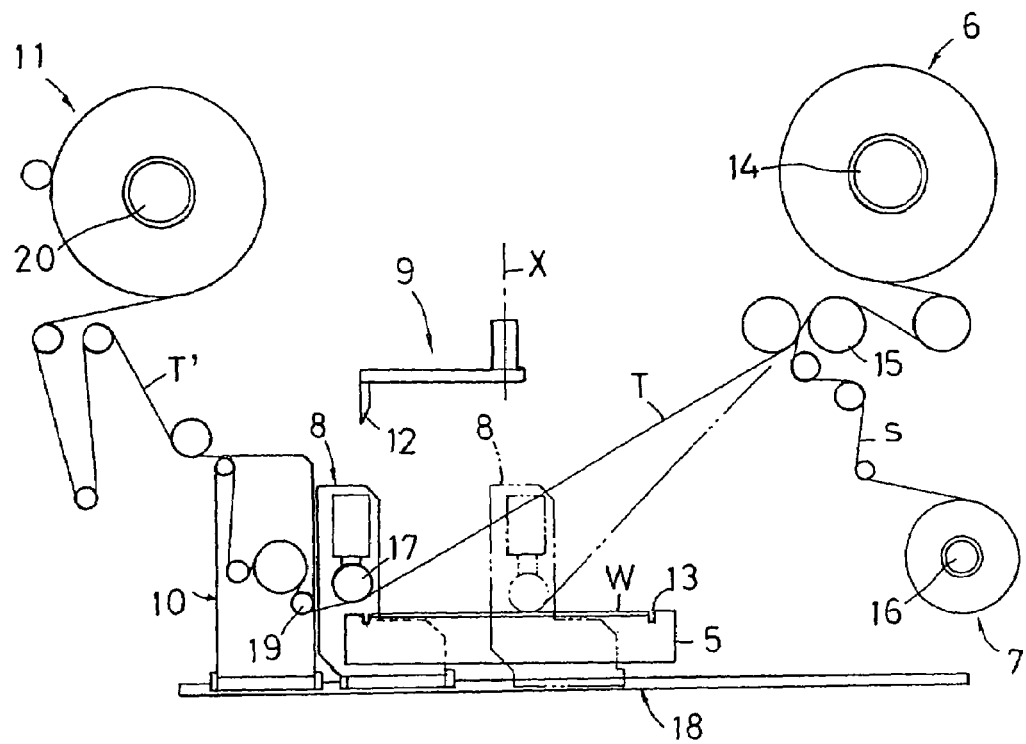
FIG. 7 illustrates an operation of the apparatus according to the embodiment.
Figure 8:
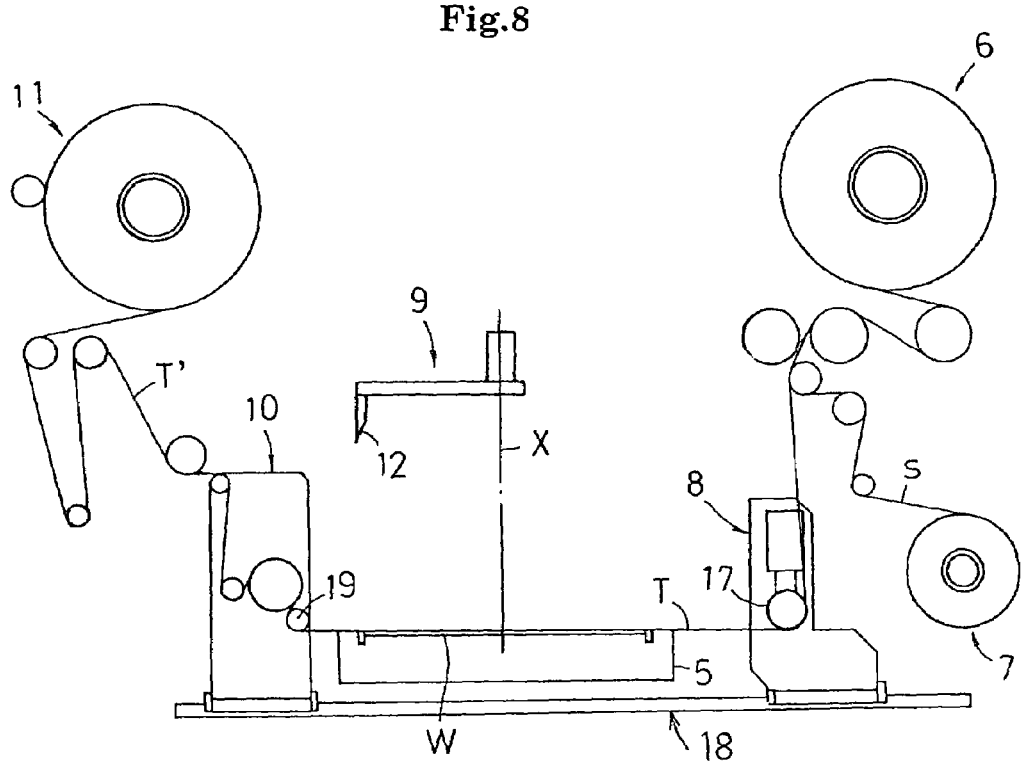
FIG. 8 illustrates an operation of the apparatus according to the embodiment.

(4) Next, as indicated by the virtual line in FIG. 7, the joining roller 17 in the joining unit 8 is descended and, also, the joining roller 17 is rolled forward (i.e., rightward in FIG. 7) on the wafer W while pressing the protective tape T downward. With this rolling of the joining roller 17, the protective tape T is joined over the entire surface of the wafer W (see FIG. 8).

Figure 9:
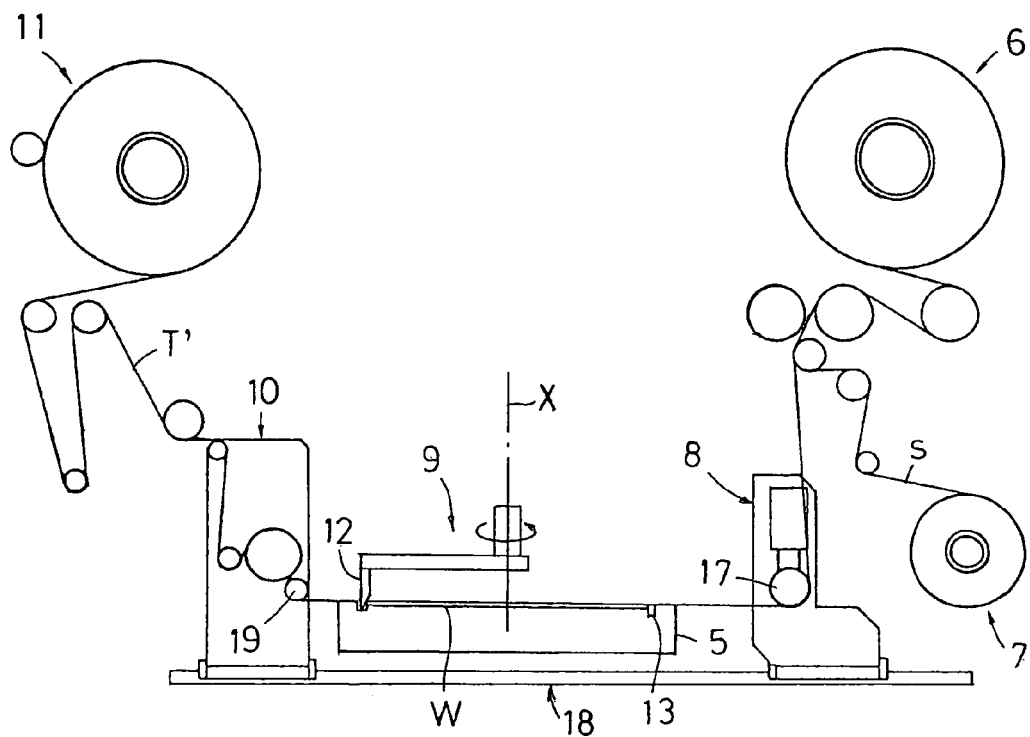
FIG. 9 illustrates an operation of the apparatus according to the embodiment.

(5) Thereafter, when the joining unit 8 reaches a distal end, the cutter blade 12, which has stood by in a predetermined upper turn phase, is descended to stick out of the protective tape T in the cutter traveling groove 13 formed at the chuck table 5, as shown in FIG. 9.

Herein, the cutter blade 12 is controllably adjusted based on previously stored information on a workpiece such as the type or size of wafer W, the type of protective tape T and chamfering specifications of a wafer peripheral edge prior to the descending operation of the cutter blade 12.

That is, the support arm 22 advances/retreats according to the operational control of the air cylinder 29 shown in FIG. 2 based on the input information, so that the cutter blade 12 is moved and adjusted up to a reference position, at which the turn radius of the cutter blade 12 becomes equal to the wafer radius. Further, the piston rod 58a of the air cylinder 58, as shown in FIG. 5, is driven to extend at a predetermined position at which the piston rod 58a slightly presses and moves the spring receiving fitting 55 against the spring, and then, the cutter blade 12 is corrected to a position slightly displaced outside of the peripheral edge of the wafer W. In this state, the cutter blade 12 is descended, so that the cutter blade 12 sticks out of the protective tape T without any interference with or contact with the wafer W.

In this case, the cutter blade 12 sticks out of the protective tape T in the state where the cutting angle α in the advance direction of the cutter blade 12 is adjusted by the control of the pulse motor 37 shown in FIG. 3 based on the input information. Thereafter, the crossing angle β of the cutter blade 12 with respect to the surface of the wafer is adjusted by the control of the pulse motor 50 shown in FIG. 3 based on the input information.

(6) When the cutter blade 12 sticks out of the protective tape T at the predetermined position in the predetermined posture, the support arm 22 is driven to be rotated in the predetermined direction by the motor 27 shown in FIG. 2. In association with this, the cutter blade 12 is turned and moved on the axis X; thus, the protective tape T is cut in conformity with the outer shape of the wafer. In this case, upon the start of the advance travel of the cutter blade 12, the air cylinder 58 shown in FIG. 5 is switched to a freely expandable/contractile state, so that the cutter supporting member 33 is slid and biased toward the turn center of the cutter blade by the spring 56. As a consequence, the cutter blade 12 travels in slide contact with the peripheral edge of the wafer W under an adequate pressure by the slide bias force of the spring 56; thus, the tape is cut in conformity with the outer shape of the wafer W.

Figure 11:
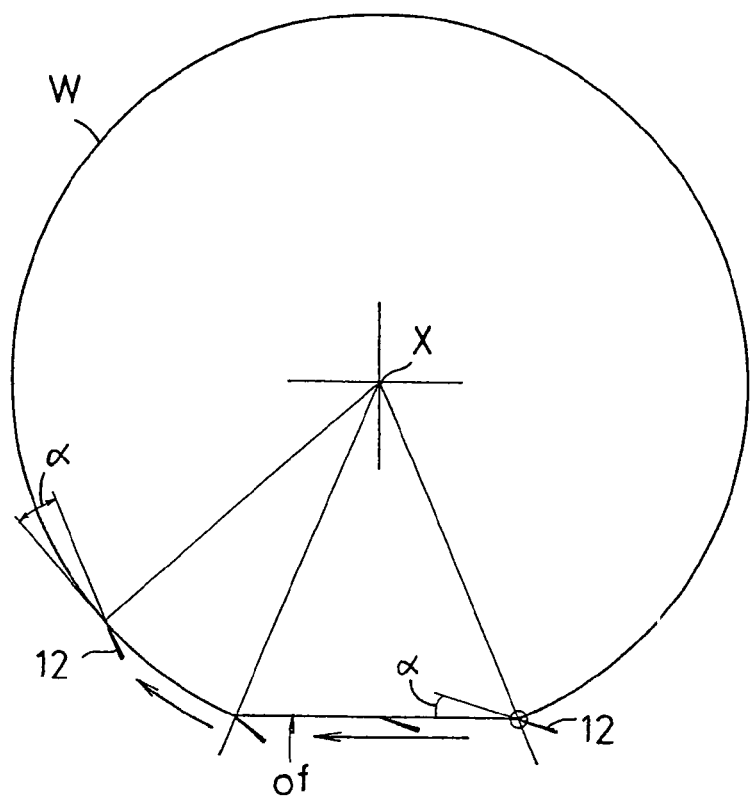
FIG. 11 illustrates tape cutting procedures on a semiconductor wafer with an orientation flat.

Herein, as shown in FIG. 11, in the case where the wafer W provided with the positioning orientation flat "of" at the outer periphery thereof is to be cut, the cutter blade 12 is turned and travels at one end of the orientation flat "of" as a tape cutting base point. In other words, the cutting angle α with respect to the advance direction of the cutter blade 12 can be kept at a predetermined value by controlling the pulse motor 37 based on the previously input/set program in association with the detection of the position in the turning direction of the cutter blade 12.

Figure 12:
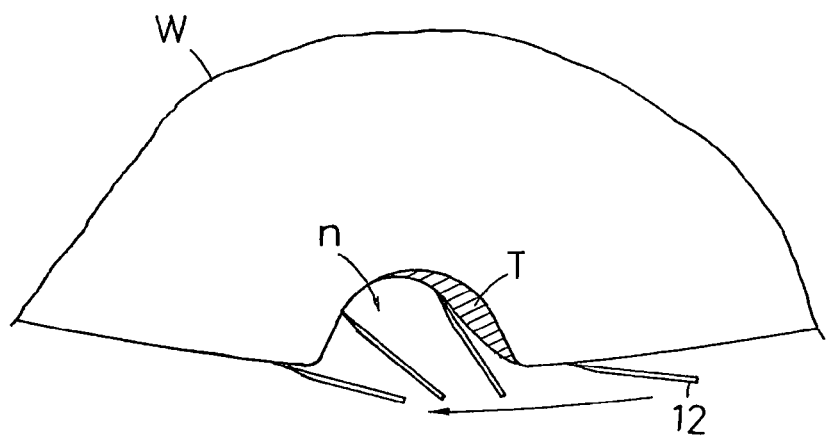
FIG. 12 illustrates tape cutting procedures on a semiconductor wafer with a notch.

Otherwise, in the case where the wafer W provided with the positioning notch n at the outer periphery thereof is to be cut, the cutting angle α is controlled to be varied in cooperation with the advance of the cutter blade 12, which is bitten in the notch n, by controlling the pulse motor 37 based on the previously input/set program in association with the detection of the position in the turning direction of the cutter blade 12 when the cutter blade 12 reaches within the notch n forming range, as shown in FIG. 12. Consequently, the tape can be cut out with few cutting remainder of the protective tape T inside of the notch n.

Additionally, the turning plate 31c biased and held in the predetermined turning posture with respect to the support plate 35 can be relatively turned on the axis Y in the same direction as the cutter turning direction with respect to the support plate 35, which is controlled to be securely held in a predetermined angular posture. As a consequence, if the advance of the cutter blade 12 is delayed caused by a large tape cutting resistance acting during the tape cutting operation, the turning plate 31c is relatively turned against the spring 42. As a result, the tape cutting operation is continued at the enlarged cutting angle α in the advance direction of the cutter blade 12. In this manner, the cutter blade 12 is displaced in such a manner as to bite the peripheral edge of the wafer W by displacing the cutter blade 12 in a direction in which the cutting angle α becomes large in the advance direction of the cutter blade 12 if the large tape cutting resistance acts during the tape cutting operation, thus cutting the protective tape without any deviation.

Figure 10:
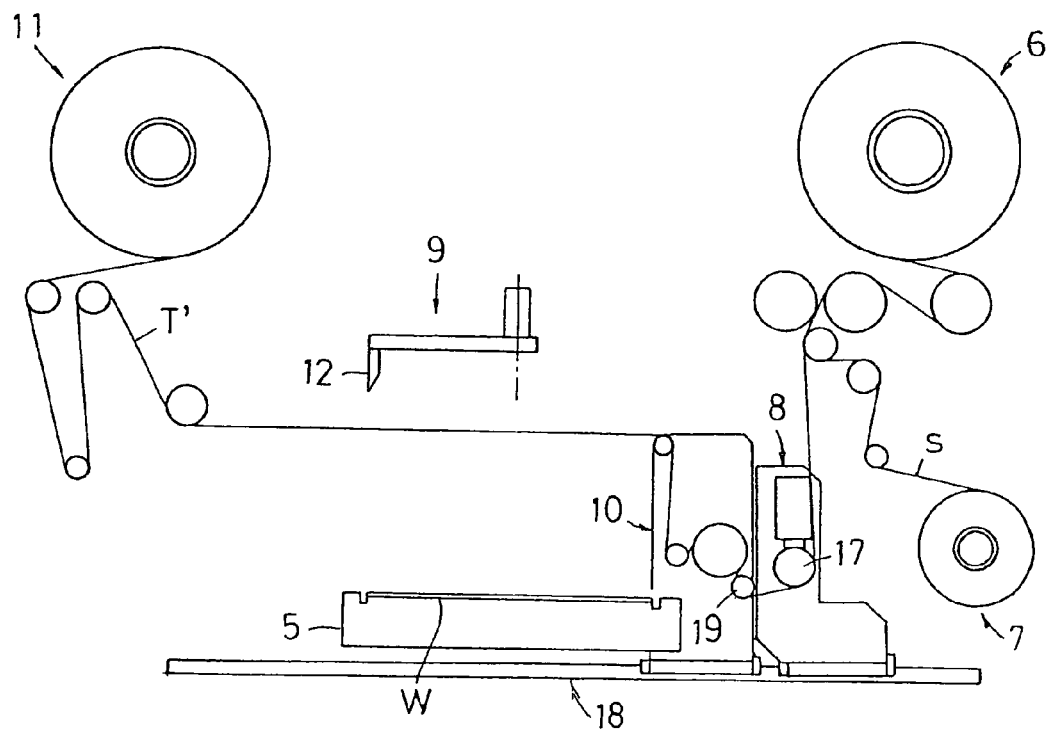
FIG. 10 illustrates an operation of the apparatus according to the embodiment.

(7) Upon completion of the tape cutting operation along the outer periphery of the wafer W, the cutter blade 12 is ascended up to the original standby position, as shown in FIG. 10. Thereafter, the separating unit 10 winds up and separates the unnecessary tape T' remaining after the tape T is cut out on the wafer W while the separating unit 10 is moved forward.

(8) When the separating unit 10 reaches the completion position of the separating operation, the separating unit 10 and the joining unit 8 are moved in the directions reverse to each other, and then, return to their original positions, respectively. At this time, the unnecessary tape T' is wound around the collecting bobbin 20 and, also, a constant quantity of protective tape T is unreeled from the tape supplying unit 6.

(9) Upon completion of the tape joining operation, the suction to the chuck table 5 is released, and thereafter, the wafer W, which has been subjected to the joining operation, is transferred onto the wafer holder 2a of the robot arm 2, to be inserted into and collected to the cassette C in the wafer supplying/collecting unit 1.

The above-mentioned operation is a series of tape joining procedures, and thereafter, will be repeated in sequence.

Although the air cylinder, the pulse motor and the like are used as the actuator for controllably adjusting the posture or position of the cutter blade 12 in this embodiment, an electric cylinder, a solenoid and the like may be used. The type of actuator may be appropriately selected according to a stroke, an operating force, a response speed or the like required for the adjustment control.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for joining a protective tape, comprising:
   protective tape supplying means for supplying a protective tape onto a surface of a semiconductor wafer mounted on and held by a chuck table;
   a joining unit for rolling a joining roller on the protective tape, thereby joining the protective tape to the surface of the semiconductor wafer while pressing the protective tape against the semiconductor wafer;
   a protective tape cutting mechanism for cutting the joined protective tape in conformity with an outer shape of the semiconductor wafer while allowing the cutter blade to travel along the outer periphery of the semiconductor wafer in a state where a cutter blade sticks out of the protective tape joined onto the semiconductor wafer;
   cutter ascending/descending means, provided in the protective tape cutting mechanism, for ascending/descending the cutter blade between an upper standby position and a lower cutting acting position;
   cutter turning means for turning the cutter blade located at the cutting acting position on a vertical axis passing substantially through the center of the chuck table; and
   plural adjusting means such configured as to be independently controlled by an actuator in such a manner as to vary a posture or position of the cutter blade,
   wherein one of the plural adjusting means is adjusting means for forcibly tilting the cutter blade on a tape cutting point of the cutter blade by means of the actuator, so as to vary a crossing angle of the cutter blade with respect to the surface of the semiconductor wafer,
   wherein the cutter blade is attached through a cutter supporting member, said cutter supporting member being attached to a front face of a movable member and a slide block being attached to a back face of the movable member, said slide block slidably fitted around a partly arcuate guide rail attached to a front face of a vertical side, and
   wherein a curvature center of the guide rail is set to be positioned at the cutting point of the cutter blade with the guide rail serving as a fulcrum.

2. The apparatus of claim 1, wherein
   one of the plural adjusting means is adjusting means for turning and varying the cutter blade on an axis along a back edge of a tip of the cutter blade by means of the actuator, so as to vary a cutting angle with respect to an advancing direction of the cutter blade.

3. The apparatus of claim 2, wherein
   the adjusting means turnably supports the cutter blade relatively to a member forcibly turned by the actuator within a set range on the axis along the back edge of the blade tip and, also, turningly biases the cutter blade in a direction reverse to a cutter turning direction.

4. The apparatus of claim 1, wherein
one of the plural adjusting means is adjusting means for forcibly moving the cutter blade to plural positions at different distances from a turn center of the cutter blade by means of the actuator.

5. The apparatus of claim 1, wherein
one of the plural adjusting means is adjusting means for movably supporting the cutter blade in its turning radial direction, biasing the cutter blade in a direction approaching a turn center, and forcibly moving the biased cutter blade by means of the actuator in a direction reverse to the bias direction of the cutter blade when advance of the cutter blade is delayed by a large tape cutting resistance.

6. The apparatus of claim 1, wherein
the plural adjusting means include:
first adjusting means for turnably supporting the cutter blade relatively to a member forcibly turned by the actuator within a set range on the axis along the back edge of the blade tip and, also, turningly biasing the cutter blade in a direction reverse to a cutter turning direction;
second adjusting means for forcibly tilting the cutter blade on a tape cutting point of the cutter blade by means of the actuator, so as to vary a crossing angle of the cutter blade with respect to the surface of the semiconductor wafer;
third adjusting means for forcibly moving the cutter blade to plural positions at different distances from a turn center of the cutter blade by means of the actuator; and
fourth adjusting means for movably supporting the cutter blade in its turning radial direction, biasing the cutter blade in a direction approaching a turn center, and forcibly moving the biased cutter blade by means of the actuator in a direction reverse to the bias direction when advance of the cutter blade is delayed by a large tape cutting resistance.

* * * * *